US006897705B2

(12) United States Patent
Idei et al.

(10) Patent No.: US 6,897,705 B2
(45) Date of Patent: May 24, 2005

(54) SEMICONDUCTOR DEVICE USING CURRENT MIRROR CIRCUIT

(75) Inventors: Yoji Idei, Tokyo (JP); Yusuke Shimizu, Tokyo (JP)

(73) Assignees: Elpida Memory, Inc., Tokyo (JP); Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/669,304

(22) Filed: Sep. 24, 2003

(65) Prior Publication Data

US 2004/0061550 A1 Apr. 1, 2004

(30) Foreign Application Priority Data

Sep. 26, 2002 (JP) ....................................... 2002/280855

(51) Int. Cl.[7] .................................................. H03L 5/00

(52) U.S. Cl. ........................... 327/333; 326/63; 326/68; 326/80; 326/81

(58) Field of Search ................................ 327/333, 538, 327/540; 326/62, 63, 65, 66, 68, 70, 71, 75, 76, 77, 80, 81

(56) References Cited

U.S. PATENT DOCUMENTS 6,392,627 B1 * 5/2002 Maekawa .................... 345/98
6,483,766 B2 * 11/2002 Lee ....................... 365/230.06
6,710,632 B2 * 3/2004 Tada .......................... 327/108

FOREIGN PATENT DOCUMENTS

JP 11-242204 5/2003

* cited by examiner

Primary Examiner—Tuan T. Lam
(74) Attorney, Agent, or Firm—Scully, Scott, Murphy & Presser

(57) ABSTRACT

The semiconductor device includes a first current mirror circuit combining analog power sources and digital power sources to receive small amplitude signals and constant-voltage input signals, a second current mirror circuit for receiving a signal output from the first current mirror circuit and for level-converting the signal from analog power source to digital power source, a first node provided in the first current mirror circuit, a second node provided in the second current mirror circuit, and an inverter circuit for receiving a signal output on the basis of the voltage levels of the first node and the second node and for outputting a CMOS level signal.

7 Claims, 7 Drawing Sheets

SEMICONDUCTOR DEVICE USING CURRENT MIRROR CIRCUIT

This application claims priority to prior application JP 2002-280855, the disclosure of which is incorporated herein by reference.

BACKGROUND OF THE INVENTION

The present invention relates to a semiconductor device which uses current mirror circuits to generate CMOS level signals from small amplitude signals.

With the recent trend toward higher speed and reduced power consumption in microprocessors, there has been an increasing demand for DRAMs featuring higher-speed data transfer and DRAMs permitting reduced power consumption. To meet customers' needs, efforts have been focused on the development of 288 Mbit Direct Rambus DRAM chips capable of achieving both higher-speed operations and reduced power consumption. In order to meet the customers' needs described above, it is necessary to accomplish lower internal voltages of peripheral circuits (DLL circuit and logic circuit) which are most responsible for current drain. However, the DLL circuit of the peripheral circuits is required to operate the transistors of a current mirror circuit in saturation regions to generate stable-duty clocks (duty=50±1%). For this reason, the supply voltage of the DLL circuit must be set to at least 2.0 V.

Meanwhile, the supply voltage of a logic circuit can be dropped to an extent that does not affect the characteristics of the circuit or its high-speed operation. In the development efforts, the supply voltage of the DLL circuit should be set to 2.0 V and the supply voltage of the logic circuit should be set to 1.8 V or less to satisfy the characteristics of both circuits and to realize higher-speed operation and reduced power consumption at the same time. This requires the re-designing of the level converting circuit for transferring signals between the DLL circuit and the logic circuit.

FIG. 1 is an example of a conventional level converting circuit (refer to, for example, Japanese Unexamined Patent Publication No. 11-242204).

The conventional level converting circuit performs the level conversion of small amplitude signals CLKI and CLKIB in a DLL circuit into a CMOS level signal CLKO and supplies the CMOS level signal CLKO to the logic circuit. In this case, the supply voltages of the DLL circuit and the logic circuit share the same potential.

In the conventional circuit shown in FIG. 1, if the small amplitude signal CLKI is high and the small amplitude signal CLKIB is low, then an NMOS transistor N1 is ON, while an NMOS transistor N2 is OFF, and the NMOS transistor N1 causes currents to flow from a node st1*b* to common. This causes the potential at the node st1*b* to fall from the high level to the low level, thus turning PMOS transistors P1, P3 and P6 ON.

The switching of the potential of the node st1*b* from the high level to the low level causes the PMOS transistor P6 to pass currents from VDDA to a node co, thereby switching the voltage level of the node co from low to high. The switching of the potential of the node co from low to high causes a node cob to be switched from high to low and the CMOS level signal CLKO from low to high.

If the small amplitude signal CLKI is low and the small amplitude signal CLKIB is high, then the NMOS transistor N1 is OFF, while the NMOS transistor N2 is ON, and the NMOS transistor N2 causes currents to flow from a node st1 to common. This causes the potential at the node st1 to fall from high to low, turning PMOS transistors P2, P4 and P5 ON.

Thus, the potential of a node coma is switched from low to high, NMOS transistors N3 and N4 are turned ON, and the potential of the node co is switched from high to low. The switching of the potential of the node co from high to low causes the node cob to be switched from low to high, and the CMOS level signal CLKO to be switched from high to low.

In the conventional circuit, the supply voltages of the DLL circuit and the logic circuit share the same potential, so that no particular attention has been paid to the potential difference in the supply voltages of the DLL circuit and the logic circuit. If, however, the power sources of the DLL circuit and the logic circuit belong to separate systems, as in this case, then changes in the potential difference between both power sources cause mismatch between the potential of the node co shown in FIG. 2 and the logic threshold of an input of the inverter, resulting in a deteriorated duty, as shown in FIG. 3. The result is illustrated in FIG. 4.

Referring to FIG. 4, when the supply voltage of the DLL circuit is set to VDDA=2.0 V, and the supply voltage of the logic circuit (VDD) is changed from 2.0 V to 1.6 V, the duty is mismatched by about 3.5%. The amount of the mismatch exceeds a design target value of 1% or less. Thus, even if the duty is adjusted in the DDL circuit, the mismatch of the duty inevitably occurs when the signal is given to the logic circuit. As a result, the adjustment is meaningless.

SUMMARY OF THE INVENTION

It is therefore an object of the present invention to provide a semiconductor device which is capable of producing stable CMOS level signals (duty=50±1%) even when the supply voltages of a DLL circuit and a logic circuit fluctuate.

According to the present invention, there is provided a semiconductor device including a first current mirror circuit combining an analog power source and a digital power source to receive a small amplitude signal and a constant-voltage input signal, a second current mirror circuit for receiving a signal output from the first current mirror circuit and for level-converting the signal from analog power source to digital power source, a first node provided in the first current mirror circuit, a second node provided in the second current mirror circuit, and an inverter circuit for receiving a signal output on the basis of the voltage levels of the first node and the second node and for outputting a CMOS level signal.

The first current mirror circuit is preferably structured by a plurality of first PMOS transistors and a plurality of first NMOS transistors. The second current mirror circuit is preferably structured by a pair of second PMOS transistors and a pair of second NMOS transistors. The inverter circuit is preferably structured by a pair of third PMOS transistors and a pair of third NMOS transistors.

Preferably, the number of the first PMOS transistors is six, and the number of the first NMOS transistors is four.

The digital power source of the first current mirror circuit and the digital power source of the inverter circuit may be set at the same potential.

With this structure, the potential of an input signal to the inverter circuit preferably coincides with the logic threshold of an input of the inverter circuit.

The potential of the input signal and the logic threshold are set to coincide with each other so as to set a duty within the range of a predetermined target value.

The semiconductor device is, for example, a direct Rambus DRAM.

DESCRIPTION OF THE PREFERRED EMBODIMENTS

An embodiment according to the present invention will be described in conjunction with the accompanying drawings.

Figure 5:
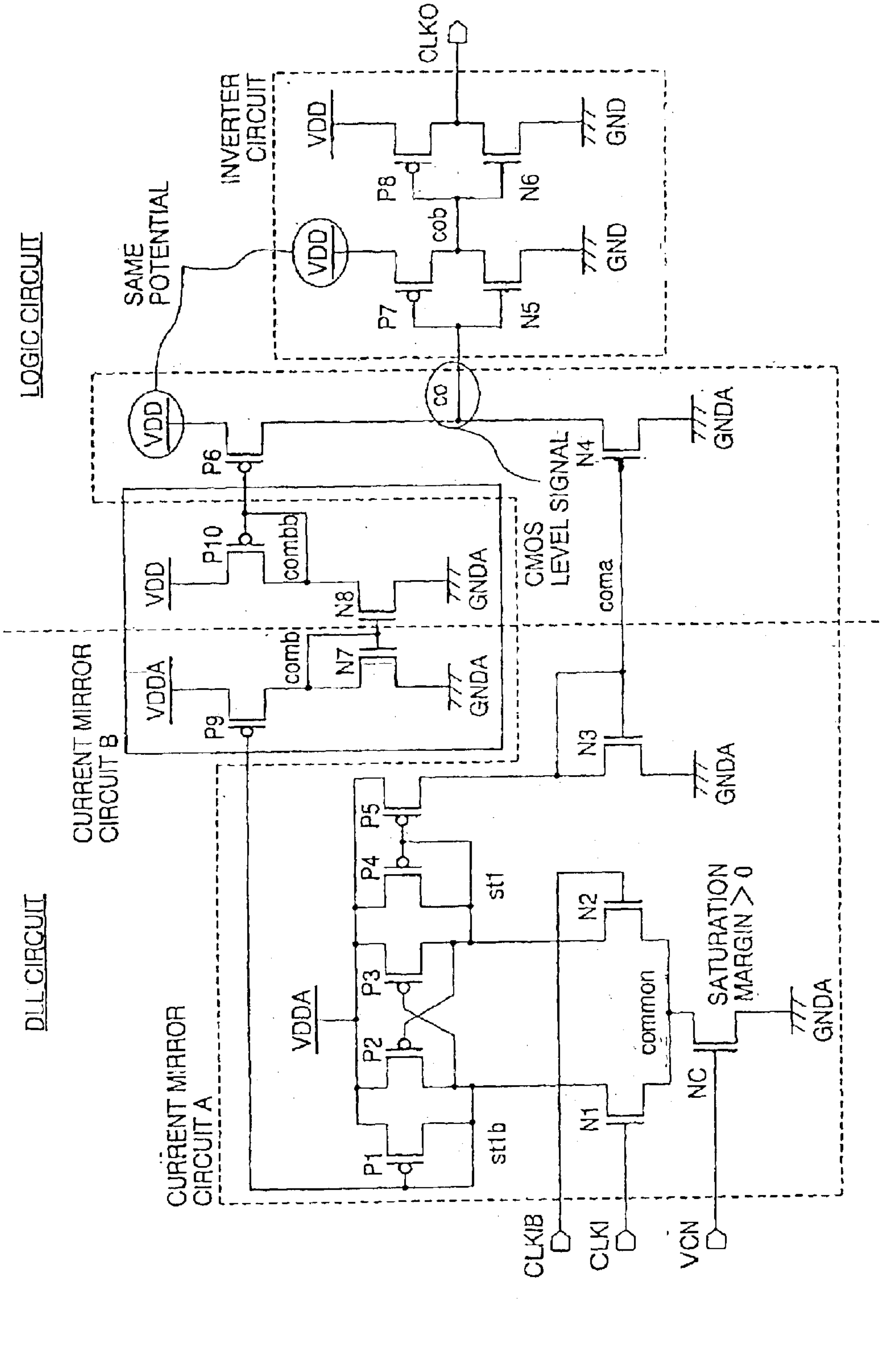
FIG. 5 shows a level converting circuit according to the present invention.

Referring to FIG. 5, description will be made of a circuit structure of an embodiment according to the present invention.

Figure 6:
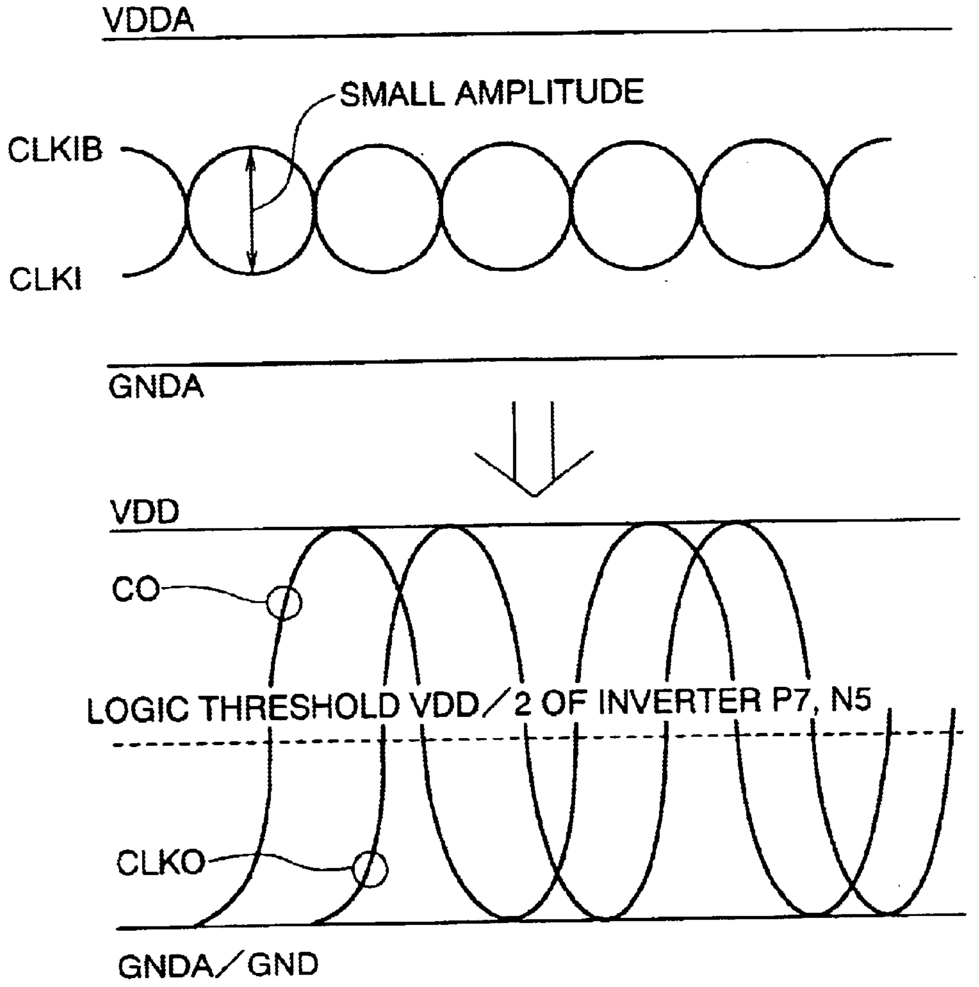
FIG. 6 illustrates the match between the potential of the node co shown in FIG. 1 and the logic threshold of the input of the inverter, which makes it possible to prevent the duty from deteriorating.

The level converting circuit according to the present invention is capable of converting small amplitude signals CLKI and CLKIB into a CMOS level signal CLKO (duty=50±1%) with a stable duty ratio even when the supply voltage levels of a DLL circuit and a logic circuit fluctuate (refer to FIG. 6). The level converting circuit is applied to, for example, a direct Rambus DRAM.

Figure 1:
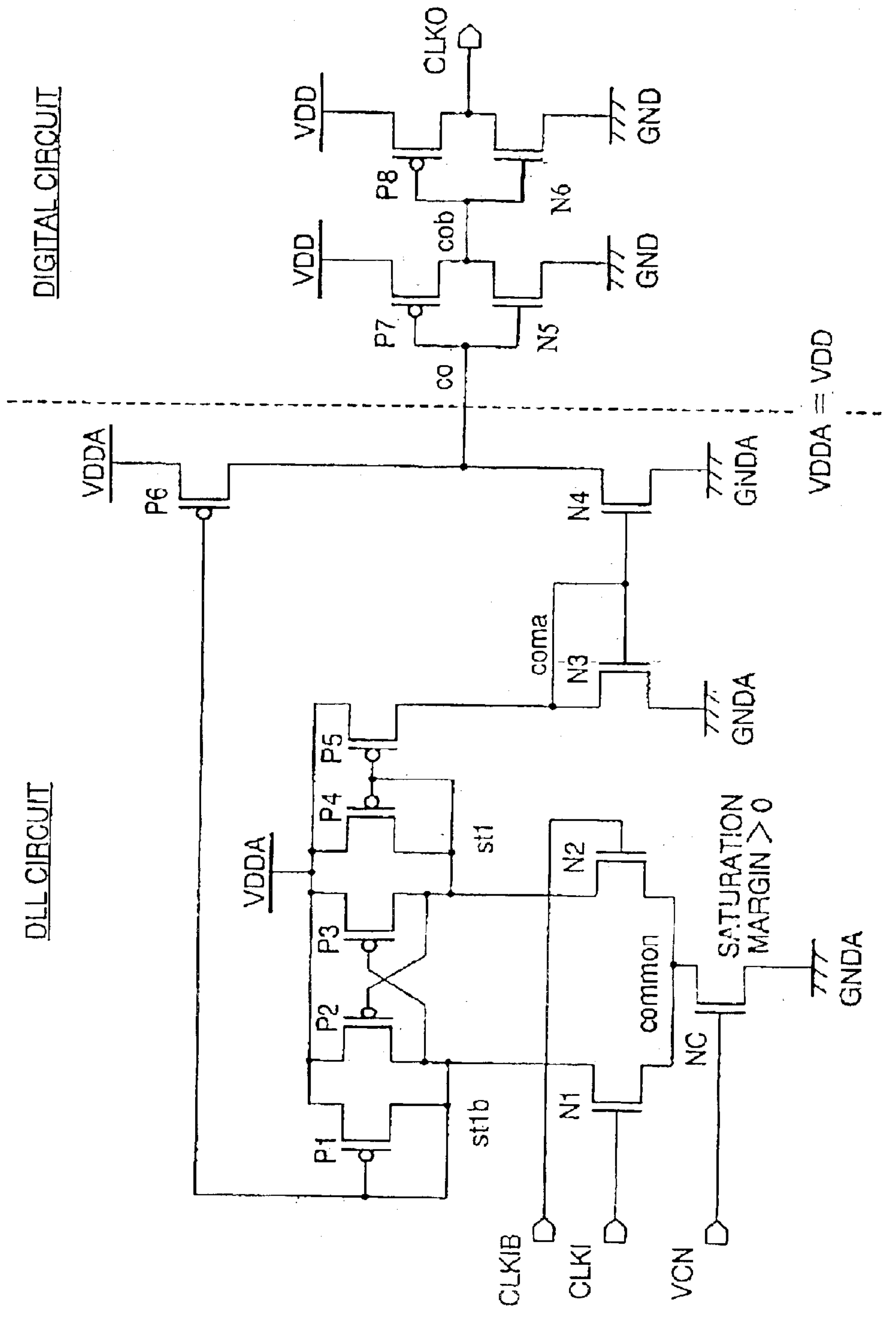
FIG. 1 (PRIOR ART)
FIG. 1 is a diagram showing a conventional level converting circuit.
Figure 2:
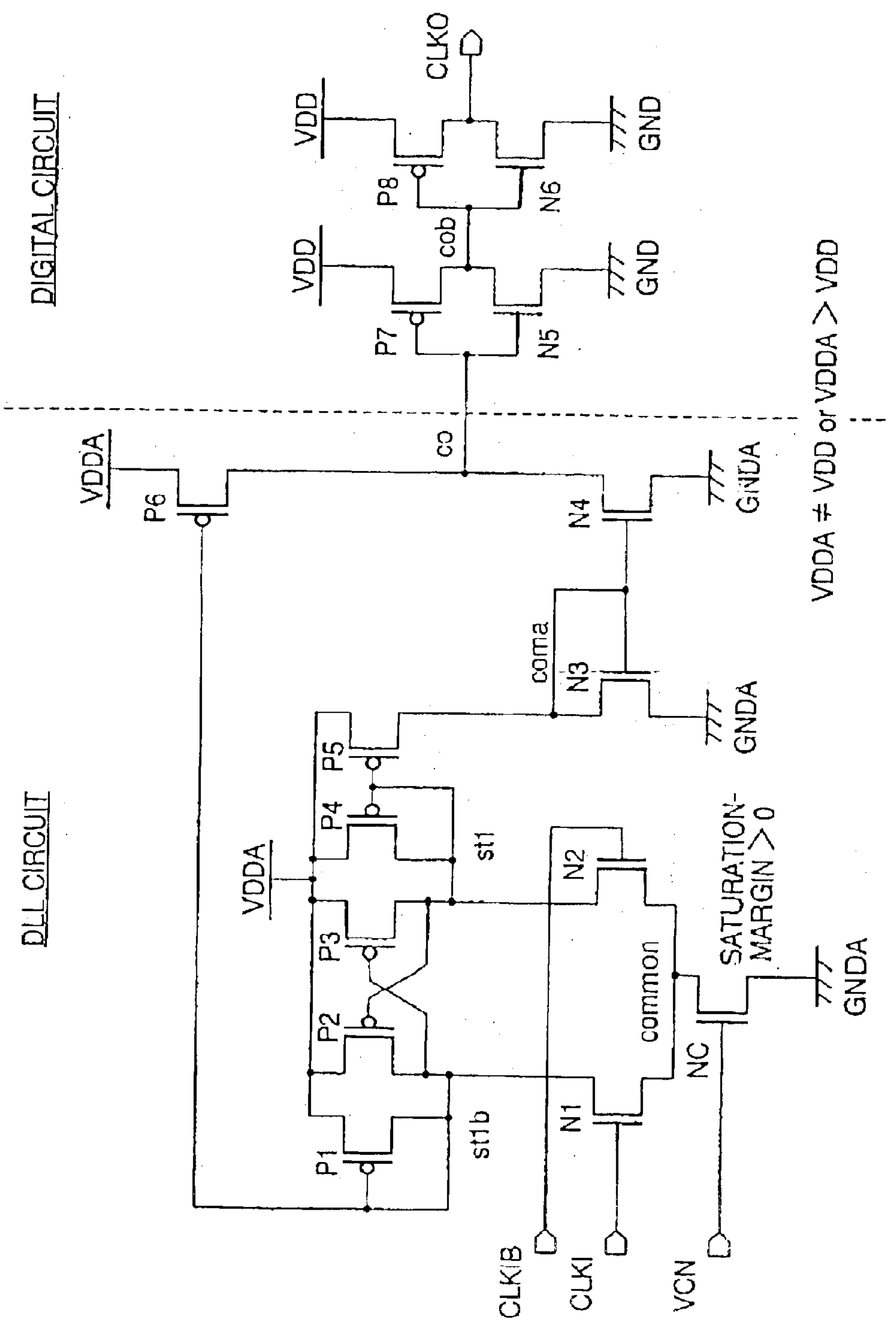
FIG. 2 (PRIOR ART)
FIG. 2 is another diagram showing the conventional level converting circuit.
Figure 3:
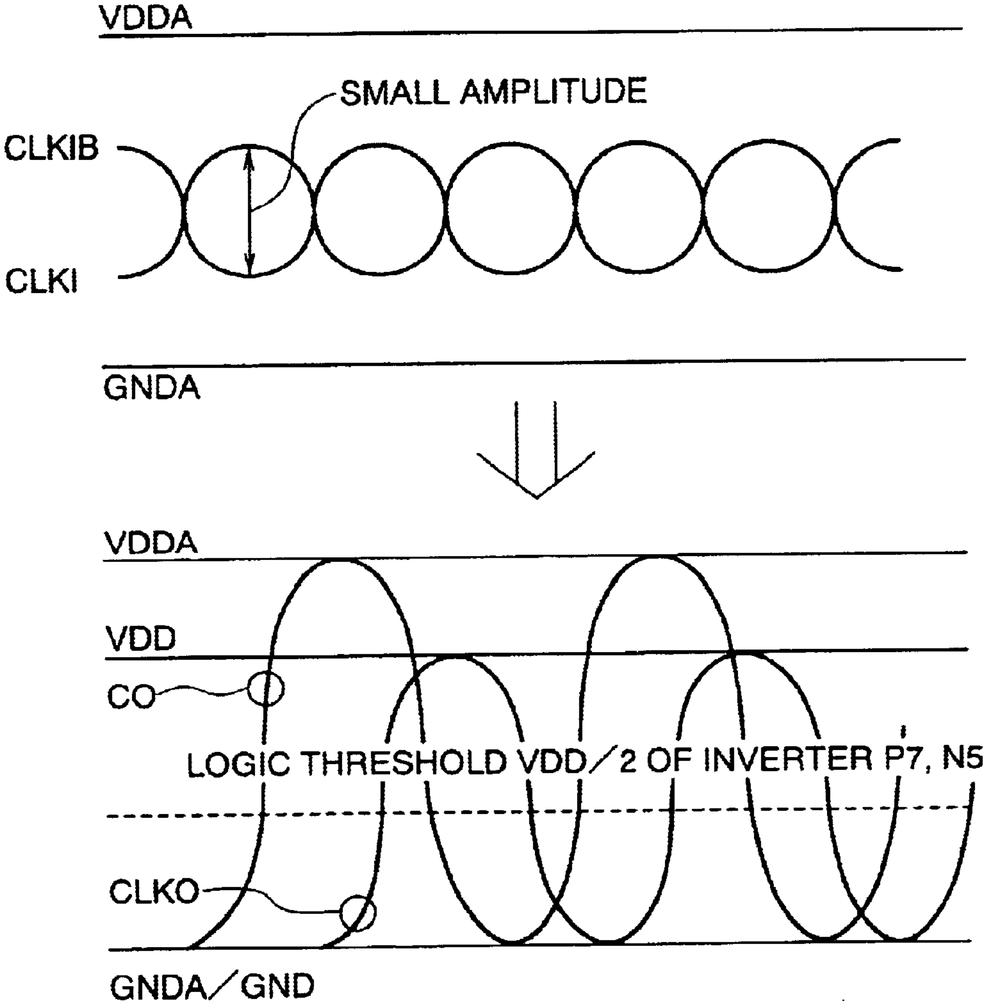
FIG. 3 (PRIOR ART)
FIG. 3 illustrates the duty deteriorated by the mismatch between the potential of a node co shown in FIG. 5 and the logic threshold of the input of the inverter.
Figure 4:
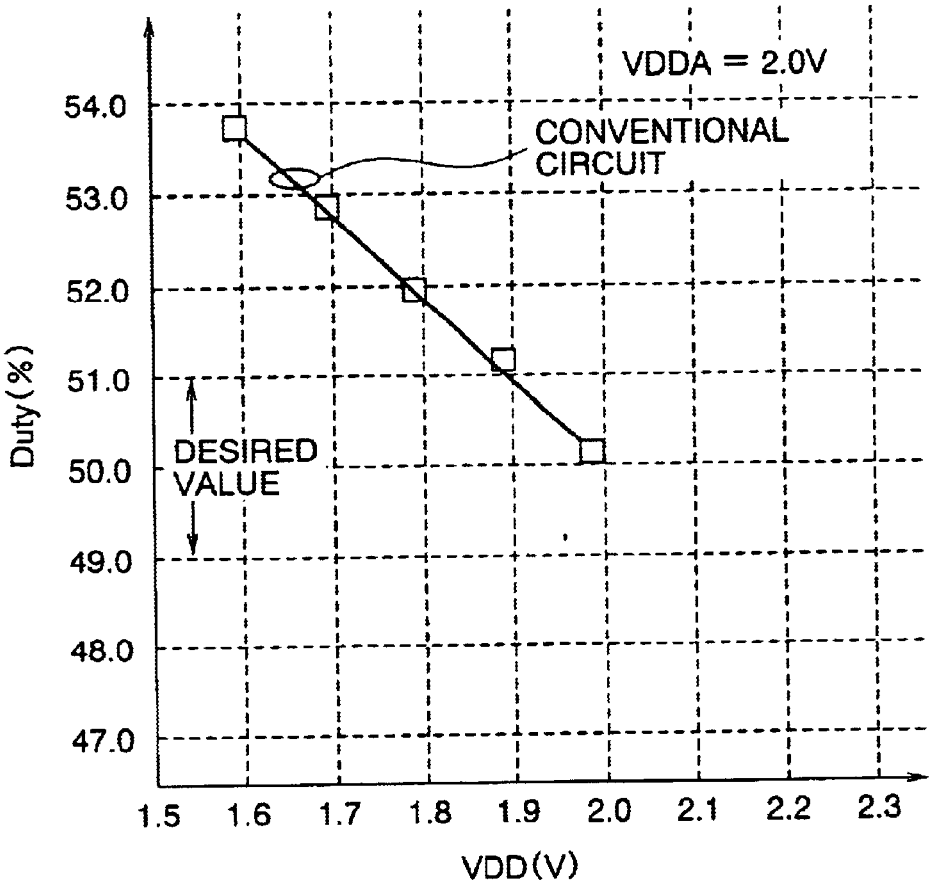
FIG. 4 (PRIOR ART)
FIG. 4 is a graph illustrating the results of the improvement shown in FIG. 6.

Unlike the conventional circuit shown in FIG. 1, the level converting circuit according to the present invention comprises a current mirror circuit A having PMOS transistors P1, P2, P3, P4, P5 and P6 and NMOS transistors N1, N2, N3, N4 and NC, a current mirror circuit B having PMOS transistors P9 and P10 and NMOS transistors N7 and N8, and an inverter circuit having PMOS transistors P7 and P8 and NMOS transistors N5 and N6.

Figure 7:
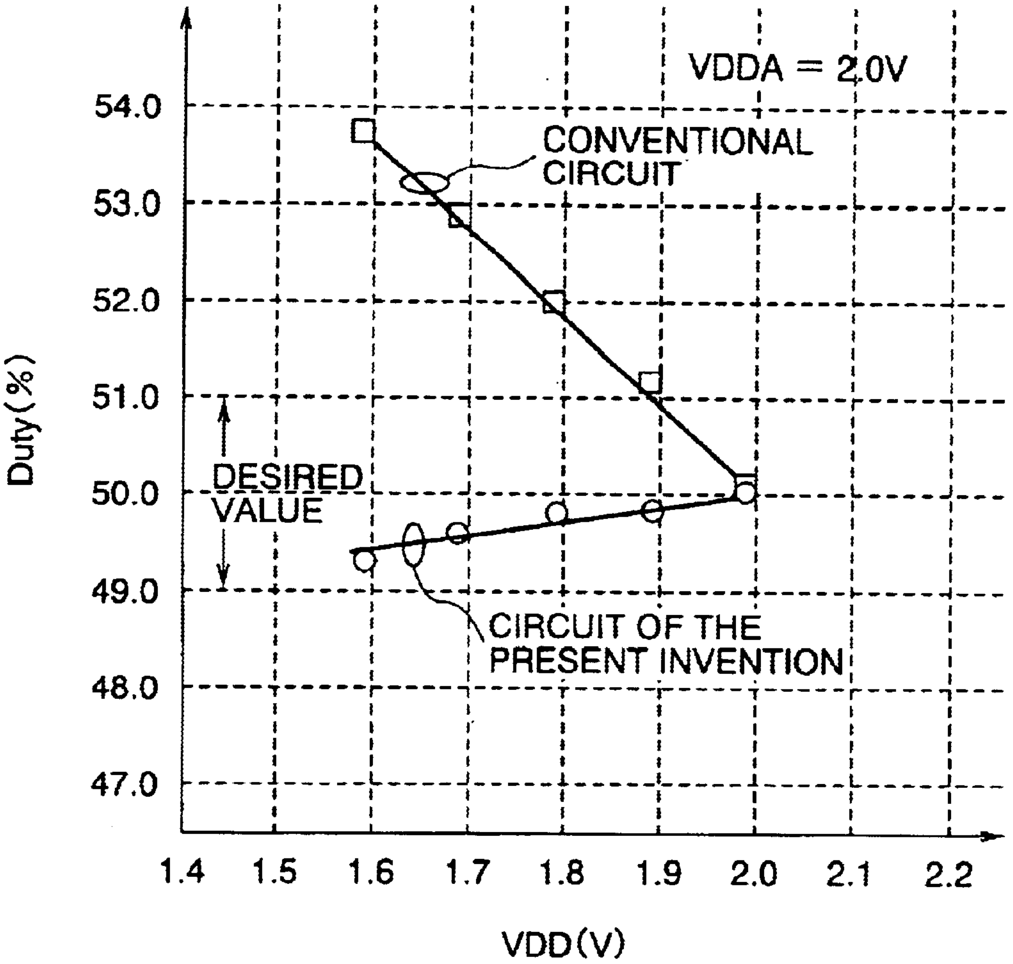
FIG. 7 is a graph illustrating the results of the mismatch shown in FIG. 3.

The major difference from the conventional circuit shown in FIG. 1 is the addition of the current mirror circuit B. The use of the current mirror circuit B makes it possible to match the potential of the node co shown in FIG. 5 with the logic threshold of the input of the inverter, thus preventing the deterioration of the duty, as shown in FIG. 6. Thus, the duty mismatch is extremely small, as compared with that in the conventional circuit. The effect is shown in FIG. 7.

The operation of the circuit according to the embodiment of the invention will now be explained.

Referring to FIG. 5, if a small amplitude signal CLKI is high and a small amplitude signal CLKIB is low, then an NMOS transistor N1 is ON, while an NMOS transistor N2 is OFF, and the NMOS transistor N1 causes currents to flow from a node st1*b* to common. This causes the potential at the node st1*b* to be fall from the high level to the low level, turning PMOS transistors P1, P3 and P9 ON.

The switching of the potential of the node st1*b* from the high level to the low level causes the PMOS transistor P9 to pass currents from VDDA to a node comb to switch the voltage of the node comb from low to high.

The switching of the potential of the node comb from low to high causes a node combb to switch from high to low. Thus, the node co switches from low to high, and a node cob switches from high to low. This causes the CMOS level signal CLKO to switch from low to high. Conversely, if the small amplitude signal CLKI is low and the small amplitude signal CLKIB is high, then the NMOS transistor N1 is OFF, while the NMOS transistor N2 is ON, and the NMOS transistor N2 causes currents to flow from a node st1 to common. This causes the potential at the node st1 to fall from high to low, turning PMOS transistors P2, P4 and P5 ON.

This causes the potential of a node coma to switch from low to high and the NMOS transistors N3 and N4 turn ON so as to switch the potential of the node co from high to low. The switching of the potential of the node co from high to low causes the node cob to switch from low to high and the CMOS level signal CLKO to switch from high to low. An NMOS transistor NC constitutes a constant-current source circuit and has a constant voltage VCN applied to its gate.

As described above, according to the present invention, even if the supply voltages of a DLL circuit and a logic circuit fluctuate (VDDA>VDD), the potential of a node (co) and the logic threshold of the input of an inverter match, thus preventing the duty from deteriorating. This makes it possible to generate the CMOS level signal CLKO having a duty of 50±1%.

Moreover, the supply voltage of the logic circuit can be reduced, allowing current drain to be reduced accordingly.

While the present invention has thus far been disclosed in conjunction with several embodiments thereof, it will be readily possible for those skilled in the art to put the present invention into practice in various other manners.

What is claimed is:

1. A semiconductor device, comprising:

a first current mirror circuit combining an analog power source and a digital power source to receive a small amplitude signal and a constant-voltage input signal;

a second current mirror circuit for receiving a signal output from the first current mirror circuit and for level-converting the signal from analog power source to digital power source;

a first node provided in the first current mirror circuit;

a second node provided in the second current mirror circuit; and an inverter circuit for receiving a signal output on the basis of voltage levels of the first node and the second node and for outputting a CMOS level signal, wherein a CMOS level signal is generated from the small amplitude signal.

2. The semiconductor device according to claim 1, wherein:

the first current mirror circuit comprises a plurality of first PMOS transistors and a plurality of first NMOS transistors, the second current mirror circuit comprises a pair of second PMOS transistors and a pair of second NMOS transistors, the inverter circuit comprises a pair of third PMOS transistors and a pair of third NMOS transistors.

3. The semiconductor device according to claim 2, wherein:

the number of the first PMOS transistors is six, and the number of the first NMOS transistors is four.

4. The semiconductor device according to claim 1, wherein:

the digital power source of the first current mirror circuit and the digital power source of the inverter circuit are set at the same potential.

5. The semiconductor device according to claim 1, wherein:

a potential of an input signal to the inverter circuit coincides with a logic threshold of an input of the inverter circuit.

6. The semiconductor device according to claim 5, wherein:

the potential of the input signal and the logic threshold are set to coincide with each other so as to set a duty within a range of a predetermined target value.

7. The semiconductor device according to claim 1, wherein:

the semiconductor device is a direct Rambus DRAM.

* * * * *